(12) United States Patent
Kuo et al.

(10) Patent No.: US 10,573,587 B2
(45) Date of Patent: Feb. 25, 2020

(54) PACKAGE STRUCTURE AND MANUFACTURING METHOD THEREOF

(71) Applicant: Industrial Technology Research Institute, Hsinchu (TW)

(72) Inventors: Shu-Wei Kuo, Hsinchu County (TW); Chun-Yi Cheng, Hsinchu (TW); Wei-Yuan Cheng, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 15/673,422

(22) Filed: Aug. 10, 2017

(65) Prior Publication Data

US 2018/0122732 A1 May 3, 2018

Related U.S. Application Data

(60) Provisional application No. 62/415,521, filed on Nov. 1, 2016.

(30) Foreign Application Priority Data

May 2, 2017 (TW) .............................. 106114549 A

(51) Int. Cl.
  *H01L 23/498* (2006.01)
  *H01L 21/48* (2006.01)
  (Continued)

(52) U.S. Cl.
  CPC ...... *H01L 23/49816* (2013.01); *H01L 21/486* (2013.01); *H01L 21/4846* (2013.01);
  (Continued)

(58) Field of Classification Search
  CPC ........... H01L 23/49816; H01L 21/4857; H01L 23/49822; H01L 23/5383
  See application file for complete search history.

(56) References Cited

U.S. PATENT DOCUMENTS 7,985,631 B2  7/2011  Zhang
9,142,514 B2  9/2015  Camacho et al.
(Continued)

FOREIGN PATENT DOCUMENTS

CN  1445824  10/2003
CN  1980542  6/2007
(Continued)

OTHER PUBLICATIONS

"Office Action of Taiwan Counterpart Application," dated Aug. 2, 2018, pp. 1-5.
(Continued)

*Primary Examiner* — Jamie C Niesz
(74) *Attorney, Agent, or Firm* — JCIPRNET

(57) ABSTRACT

A package structure includes a redistribution layer, a chip, an encapsulant, an under bump supporting layer, an attachment layer and solder balls. The redistribution layer includes a first surface, a second surface opposite to the first surface and a patterned circuit layer disposed on the first surface, wherein an outer surface of the patterned circuit layer and the first surface are coplanar. The chip is disposed on the second surface and electrically connected to the patterned circuit layer. The encapsulant is disposed on the second surface to encapsulate the chip. The under bump supporting layer is disposed on the first surface and includes openings for exposing the outer surface. The attachment layer covers the inner surface of each opening and the exposed portion of the patterned circuit layer. The solder balls are disposed in the openings respectively and electrically connected to the patterned circuit layer.

9 Claims, 12 Drawing Sheets

(51) Int. Cl.
  *H01L 21/683* (2006.01)
  *H01L 21/768* (2006.01)
  *H01L 21/56* (2006.01)
  *H01L 23/31* (2006.01)
  *H01L 23/00* (2006.01)

(52) U.S. Cl.
  CPC ...... *H01L 21/4857* (2013.01); *H01L 21/6835* (2013.01); *H01L 21/76871* (2013.01); *H01L 23/49866* (2013.01); *H01L 21/4853* (2013.01); *H01L 21/568* (2013.01); *H01L 23/3128* (2013.01); *H01L 23/49822* (2013.01); *H01L 24/16* (2013.01); *H01L 24/81* (2013.01); *H01L 2221/68345* (2013.01); *H01L 2224/16237* (2013.01); *H01L 2224/81005* (2013.01); *H01L 2224/81191* (2013.01)

(56) References Cited

U.S. PATENT DOCUMENTS

| | | |
|---|---|---|
| 2006/0115931 A1 | 6/2006 | Hsu |
| 2010/0084175 A1* | 4/2010 | Suzuki ............... H01L 21/4857 174/260 |
| 2014/0021594 A1* | 1/2014 | Yew .................... H01L 21/563 257/669 |
| 2014/0077361 A1 | 3/2014 | Lin et al. |
| 2014/0138816 A1 | 5/2014 | Lu et al. |
| 2015/0228594 A1 | 8/2015 | Alvarado et al. |
| 2015/0348957 A1 | 12/2015 | Lin et al. |
| 2015/0380334 A1 | 12/2015 | Hu et al. |
| 2016/0071816 A1 | 3/2016 | Huang et al. |
| 2016/0118332 A1* | 4/2016 | Lin ....................... H01L 22/20 257/773 |
| 2016/0163566 A1 | 6/2016 | Chen et al. |
| 2016/0163632 A1* | 6/2016 | Chen ................ H01L 23/49827 257/774 |

FOREIGN PATENT DOCUMENTS

| | | |
|---|---|---|
| CN | 101241889 | 8/2008 |
| CN | 101290917 | 10/2008 |
| CN | 101335217 | 12/2008 |
| CN | 101720165 | 6/2010 |
| CN | 101969051 | 2/2011 |
| CN | 102779767 | 11/2012 |
| CN | 104377182 | 2/2015 |
| CN | 104465575 | 3/2015 |
| CN | 104681531 | 6/2015 |
| CN | 105261606 | 1/2016 |
| CN | 105428328 | 3/2016 |
| CN | 105514086 | 4/2016 |
| CN | 105590915 | 5/2016 |
| CN | 105789176 | 7/2016 |
| TW | 201546975 | 12/2015 |
| TW | I549249 | 9/2016 |

OTHER PUBLICATIONS

"Notice of Allowance of Taiwan Related Application No. 106105304," dated Aug. 8, 2018, pp. 1-4.

Shijian Luo et al., "Study on Surface Tension and Adhesion for Flip Chip Packaging," 2001 International Symposium on Advanced Packaging Materials:Processes, Properties and Interfaces, IEEE, Mar. 2001, pp. 299-304.

"Office Action of China Counterpart Application," dated Apr. 11, 2019, p. 1-p. 10.

"Office Action of China Related Application No. 201710285973.8", dated Apr. 10, 2019, p. 1-p. 8.

"Office Action of China Counterpart Application," dated Oct. 21 2019, p. 1-p. 6.

* cited by examiner

PACKAGE STRUCTURE AND MANUFACTURING METHOD THEREOF

CROSS-REFERENCE TO RELATED APPLICATION

This application claims the priority benefits of U.S. provisional application Ser. No. 62/415,521, filed on Nov. 1, 2016 and Taiwan application serial no. 106114549, filed on May 2, 2017. The entirety of each of the above-mentioned patent applications is hereby incorporated by reference herein.

BACKGROUND

Technical Field

The disclosure relates to a package structure and a manufacturing method thereof.

Description of Related Art

The chip package is used for protecting an exposed chip, reducing the density of chip contacts, and providing better heat dissipation for the chip. However, as the number of chip contacts continues to increase, the downsizing of the chip area makes it more and more difficult to redistribute all the contacts on the chip surface in a way of screen matrix. Even if the chip surface could accommodate all the contacts, the gap between the contacts would be too small and affect the electrical reliability in the subsequent soldering process for solder balls.

Therefore, in known packaging technologies, first, an encapsulation material is used for packaging a chip, so as to increase the chip area, in which the active surface of the chip and the bottom surface of the encapsulation material are exposed outside. Then, a redistribution layer is formed on the active surface of the chip and the bottom surface of the encapsulation material, and the solder balls are formed on the contacts of the redistribution layer, respectively, for electrically connecting the chip with external contacts. Such kind of technologies, however, may easily result in the overflow of the encapsulation material during packaging, thereby causing the encapsulation material to extend onto a portion of the active surface of the chip and contaminating the active surface of the chip.

Nowadays a packaging technique is developing, in which the redistribution layer is formed on a carrier first and then the chip is disposed on the redistribution layer, and after the encapsulation material is disposed to encapsulate the chip, the carrier is removed. In this packaging technique, however, the exposed redistribution layer after the removal is completely flat and smooth, therefore, the bonding strength for connecting the chip may not be enough after the solder balls are disposed.

SUMMARY

Embodiments of the disclosure provides a package structure and a manufacturing method thereof, which may provide structural support and position alignment for bonding solder balls in the manufacturing method of forming a redistribution layer prior to disposing a chip.

According to an embodiment of the disclosure, the package structure includes a redistribution layer, a chip, an encapsulant, an under bump supporting layer, an attachment layer and a plurality of solder balls. The redistribution layer includes a first surface, a second surface opposite to the first surface and a patterned circuit layer disposed on the first surface, wherein an outer surface of the patterned circuit layer and the first surface are coplanar. The chip is disposed on the second surface and electrically connected to the patterned circuit layer. The encapsulant is disposed on the second surface to encapsulate the chip. The under bump supporting layer is disposed on the first surface and includes a plurality of openings. The openings expose the outer surface of the patterned circuit layer. The attachment layer covers an inner surface of each of the openings. The plurality of solder balls are disposed in the openings, respectively, and electrically connected to the patterned circuit layer.

According to another embodiment of the disclosure, a manufacturing method of a package structure includes the following. An under bump supporting layer is formed on a carrier. A redistribution layer is formed on the under bump supporting layer. The redistribution layer includes a first surface connected to the under bump supporting layer, a second surface opposite to the first surface, and a patterned circuit layer embedded in the first surface, wherein an outer surface of the patterned circuit layer and the first surface are coplanar. A chip is disposed on the second surface, wherein the chip is electrically connected to the patterned circuit layer. An encapsulant is disposed on the second surface to encapsulate the chip. The carrier is removed and a plurality of openings on the under bump supporting layer are formed to expose the patterned circuit layer. A plurality of solder balls are disposed in the plurality of openings, respectively, and electrically connected to the patterned circuit layer.

The foregoing will become better understood from a careful reading of a detailed description provided herein below with appropriate reference to the accompanying drawings.

DESCRIPTION OF THE EMBODIMENTS

Figure 1:
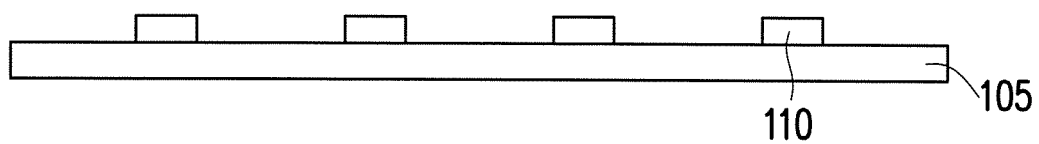
FIG. 1 to FIG. 10 are cross-sectional views showing a manufacturing method of a package structure according to an embodiment of the disclosure.

Below, exemplary embodiments will be described in detail with reference to accompanying drawings so as to be easily realized by a person having ordinary knowledge in the art. The inventive concept may be embodied in various forms without being limited to the exemplary embodiments set forth herein. Descriptions of well-known parts are omitted for clarity, and like reference numerals refer to like elements throughout.

Wording such as up, down, front, back, left and right mentioned in exemplary embodiments merely refers to the directions in the accompanying drawings without being limited to the exemplary embodiments set forth herein.

FIG. 1 to FIG. 10 are cross-sectional views showing a manufacturing method of a package structure according to an embodiment of the disclosure. According to this embodiment, the manufacturing method of the package structure includes the following. First, referring to FIG. 1, a plurality of protrusions 110 are formed on a carrier 105, wherein a gap is maintained between any two adjacent protrusions 110. In this embodiment, the carrier 105 may be a glass carrier, a wafer carrier, or a stainless steel carrier. A material of the protrusions 110 may include Polyimide (PI), Polybenzoxazole (PBO), or Polymethylmethacrylate (PMMA). Nevertheless, the scope of this disclosure is not limited to the materials of the carrier 105 and the protrusions 110.

Figure 2:
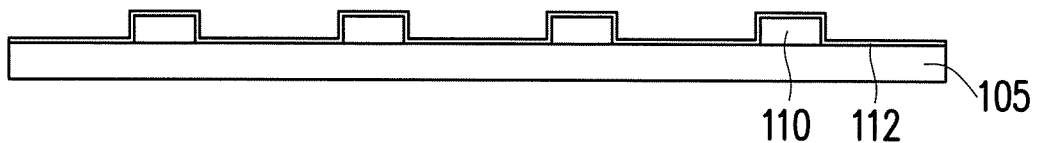

Next, referring to FIG. 2, a release layer 112 is formed on the carrier 105, wherein the release layer 112 covers the protrusions 110 and a surface of the carrier 105 exposed by the protrusions 110. In this embodiment, the disposition of the release layer 112 is optional. In other embodiments, the disposition of the release layer 112 may be omitted. The scope of this disclosure is not limited to the materials of the release layer 112 as long as the carrier 105 can be released from the package structure through the release layer 112.

Figure 3:
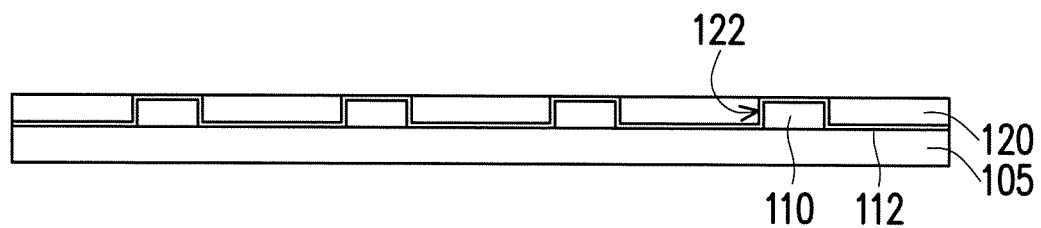

Then, referring to FIG. 3, an under bump supporting layer 120 is formed on the carrier 105. In this embodiment, the under bump supporting layer 120 may be filled between the plurality of protrusions 110, also, an upper surface of the under bump supporting layer 120 and the upper surface of the protrusions 110 are coplanar. Then the protrusions 110 define a plurality of openings 122 on the under bump supporting layer 120. A material of the under bump supporting layer 120 may include organic polymer material, inorganic polymer material, or a mixture of organic polymer material and inorganic polymer material. The organic polymer material is, for instance, Polyimide (PI), Polybenzoxazole (PBO), Benzocyclobutene (BCB), or the like. The inorganic polymer material is, for instance, silicon oxide, silicon nitride, silicon oxynitride, polysiloxane, polysilazane, polysiloxazane, polycarbosilane, or the like. The thickness of the under bump supporting layer 120 is in a range of 1 μm to 50 μm, or the thickness of the under bump supporting layer 120 is greater than or equal to one tenth of the diameter of each of the openings. So that the structural supporting for the solder balls 160 formed thereafter are provided enough, also help to the position alignment for the solder balls 160 may be provided.

Figure 5:
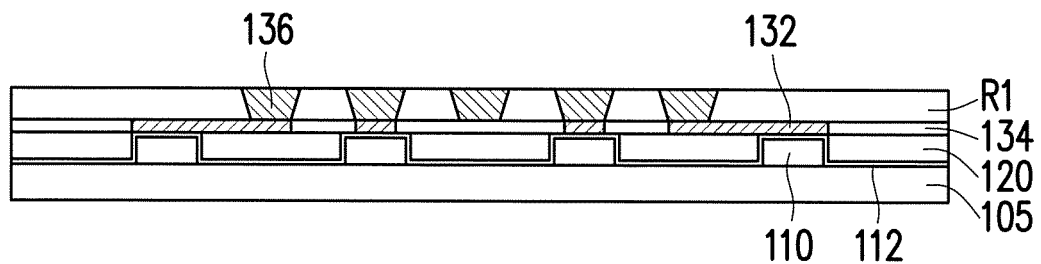
Figure 6:
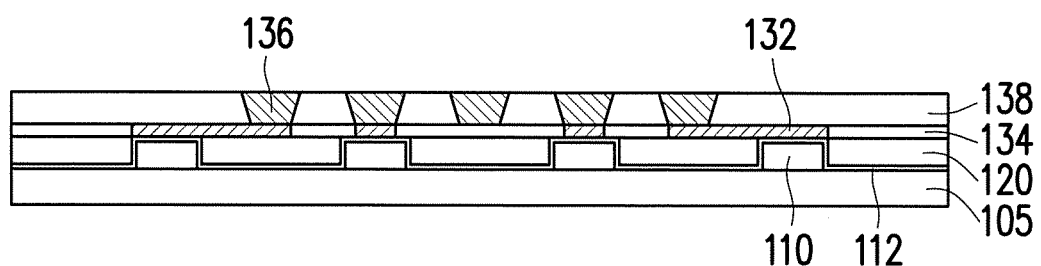
Figure 7:
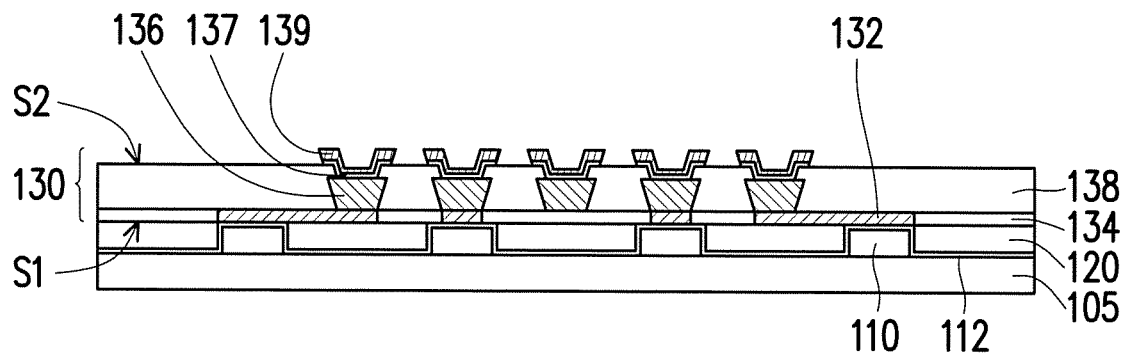

Then, FIG. 4 to FIG. 7 illustrate an embodiment on how to form a redistribution layer 130 on the under bump supporting layer 120. As shown in the embodiment of FIG. 7, the redistribution layer 130 includes a first surface S1 connected to the under bump supporting layer 120, a second surface S2 opposite to the first surface S1, and a patterned circuit layer 132 embedded in the first surface S1. Wherein an outer surface of the patterned circuit layer 132 and the first surface S1 of the redistribution layer 130 are coplanar.

Figure 4:
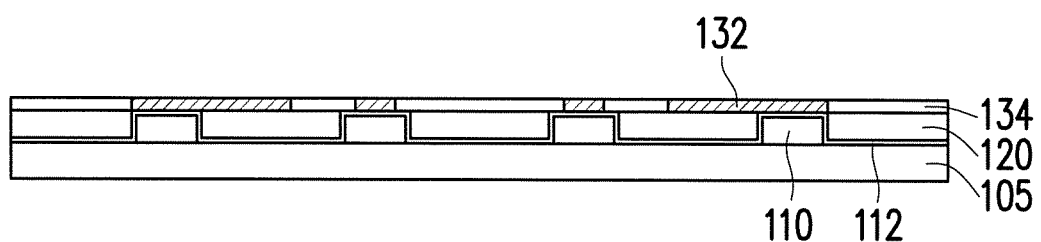

An exemplary embodiment of forming the redistribution layer 130, as shown in FIG. 4, includes the following. First, a patterned circuit layer 132 is formed on the under bump supporting layer 120, then a first dielectric layer 134 is formed on the under bump supporting layer 120, wherein the patterned circuit layer 132 is embedded in the first dielectric layer 134. So an outer surface of the patterned circuit layer 132 and the surface of the first dielectric layer 134 are coplanar because the patterned circuit layer 132 and the first dielectric layer 134 are formed on the same plane, then the first surface S1 of the redistribution layer 130 is defined. In this embodiment, the under bump supporting layer 120 is not the dielectric layer of the redistribution layer 130 but is another laminated layer, therefore the material of the under bump supporting layer 120 and the dielectric layer of redistribution layer 130 may be different.

Then, referring to FIG. 5, a plurality of conductive holes 136 are formed on the patterned circuit layer 132. In this embodiment, the method of forming the conductive holes 136 includes the following. A seed layer (not shown) is formed on the patterned circuit layer 132 and the first dielectric layer 134, a patterned photoresist layer R1 is then formed on the seed layer, wherein the patterned photoresist layer R1 includes a plurality of openings to expose a portion of the seed layer. The conductive holes 136 are formed in the openings of the patterned photoresist layer R1 by performing electroplating with the seed layer being as a conductive path. Then the patterned photoresist layer R1 is removed and the portion of the seed layer exposed by the patterned photoresist layer R1 is etched and removed, so as to complete the conductive holes 136.

Thereafter, referring to FIG. 6, a second dielectric layer 138 is formed on the first dielectric layer 134, wherein the second dielectric layer 138 surrounds the conductive holes 136 to make the conductive holes 136 pass through the second dielectric layer 138. The conductive holes 136 are connected to the first surface S1 and the second surface S2 of the redistribution layer 130. Then, as shown in FIG. 7, an under ball metal layer 139 is formed on the second dielectric layer 138, and the under ball metal layer 139 is electrically connected to the conductive holes 136.

Similar to the method of forming the conductive holes 136 described above, the method of forming the under ball metallization layer 139 includes the following. First, a seed layer 137 is formed in the conductive holes 136 and on the second dielectric layer 138. Then, a patterned photoresist layer is formed on the seed layer 137, and the openings of the patterned photoresist layer expose the conductive holes 136. Thereafter, the under ball metallization layer 139 is formed in the openings of the patterned photoresist layer, by performing electroplating with the seed layer 137 being as a conductive path. Then, the patterned photoresist layer is removed and the portion of the seed layer 137 exposed by the patterned photoresist layer is etched and removed, so as to complete the under ball metal layer 139 as shown in FIG. 7.

Figure 8:
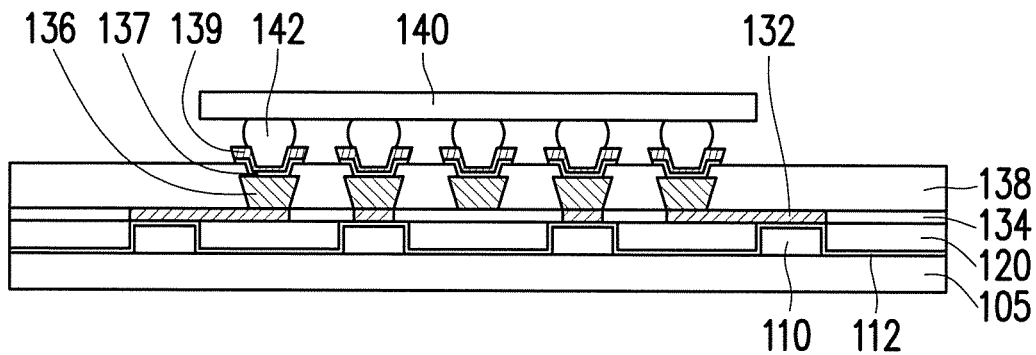

Next, referring to FIG. 8, a chip 140 is disposed on the second surface S2 of the redistribution layer 130. In this embodiment, the chip 140 is disposed on the under ball metal layer 139 of the redistribution layer 130 by a flip-chip bonding process with the use of a plurality of conductive bumps 142, and the chip is electrically connected to the patterned circuit layer 132 via the under ball metal layer 139 and the conductive holes 136.

Figure 9:
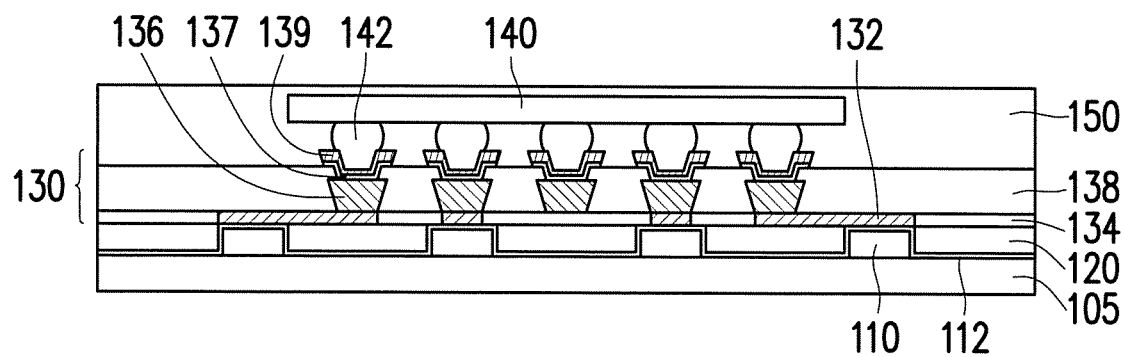

Then, referring to FIG. 9, an encapsulant 150 is formed on the second surface S2 of the redistribution layer 130 to encapsulate the chip 140. The carrier 105 and the protrusions 110 are then separated from the under bump supporting layer 120 to remove the carrier 105 and the protrusions 110, and openings 122 on the under bump supporting layer 120 are formed at the same time to expose the patterned circuit layer 132. In more detailed, the openings 122 of the under bump supporting layer 120 expose the outer surface of the patterned circuit layer 132. In this embodiment, the process of removing the carrier 105 is performed, for example, in a mechanical manner. Or, the carrier 105 may be removed by performing irradiation, laser or heating to the release layer 112. The scope of the present disclosure is not limited thereto.

In addition, since the removal of the carrier 105 may easily apply stress on the package structure and results in breakage of the circuit in the redistribution layer 130, therefore in this embodiment, a Young's modulus of the first dielectric layer 134 of the redistribution layer 130 may be less than a Young's modulus of the second dielectric layer 138. The Young's modulus of the first dielectric layer 134 may be less than 10 GPa. In other words, in the redistribution layer 130, the dielectric layer closer to the carrier 105 is softer than the dielectric layer away from the carrier 105, so as to help absorbing the stress applied on the dielectric layer away from the carrier 105 due to the removal of the carrier 105, and thereby preventing the breakage of the circuit in the dielectric layer. For example, since an inorganic material is harder than an organic material, in an embodiment, the material of the first dielectric layer 134 may include an organic material or a mixture of organic and inorganic materials, while the material of the second dielectric layer 138 may include an inorganic material. Alternatively, in another embodiment, the material of the first dielectric layer 134 may be an organic material, while the material of the second dielectric layer 138 may include an inorganic material or a mixture of organic and inorganic materials. The aforesaid organic material is, for instance, Polyimide (PI), Polybenzoxazole (PBO), Benzocyclobutene (BCB), or the like. The aforesaid inorganic material is, for instance, silicon oxide, silicon nitride, silicon oxynitride, polysiloxane, polysilazane, polysiloxazane, polycarbosilane, or the like. In this embodiment, the material of the under bump supporting layer 120 may include an organic polymer material.

Figure 10:
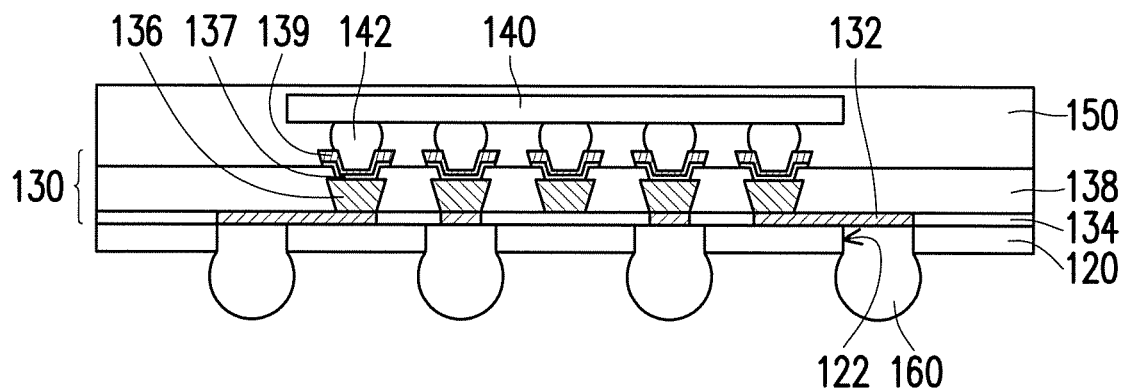

Next, referring to FIG. 10, a plurality of solder balls 160 are formed in the openings 122 of the under bump supporting layer 120, wherein the solder balls 160 are electrically connected to the patterned circuit layer 132. Accordingly, the manufacturing of the package structure 100 of this embodiment is substantially completed. With this configuration, the manufacturing method of the package structure 100 of this embodiment, in which the redistribution layer 130 is formed prior to the disposition of the chip 140, may form the under bump supporting layer 120 having the plurality of openings 122 when the carrier 105 is removed. Then the structural supporting are provided enough and help to the position alignment for the solder balls 160 are provided, so as to increase the reliability of the package structure 100. In addition, the under bump supporting layer 120 also prevent the moisture from entering the package structure 100, thereby increasing the ability of the package structure 100 to block moisture and/or the ability of the package structure 100 of oxidation resistance.

Figure 11:
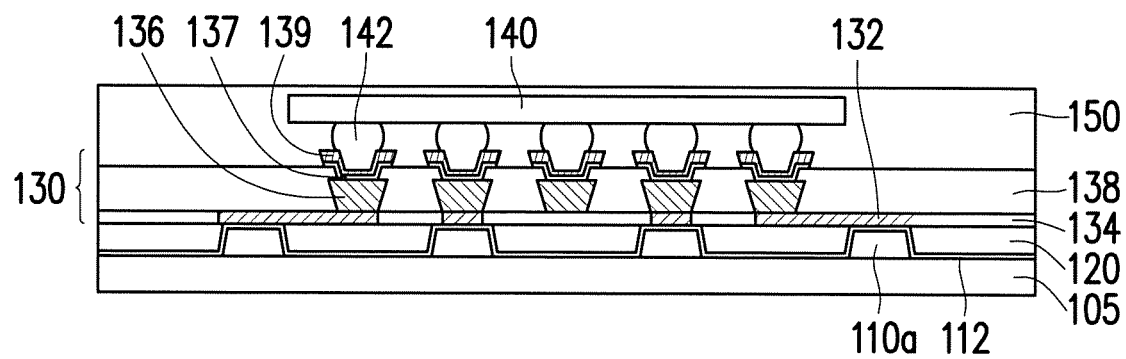
FIG. 11 is a cross-sectional view showing a package structure according to another embodiment of the disclosure.
Figure 12:
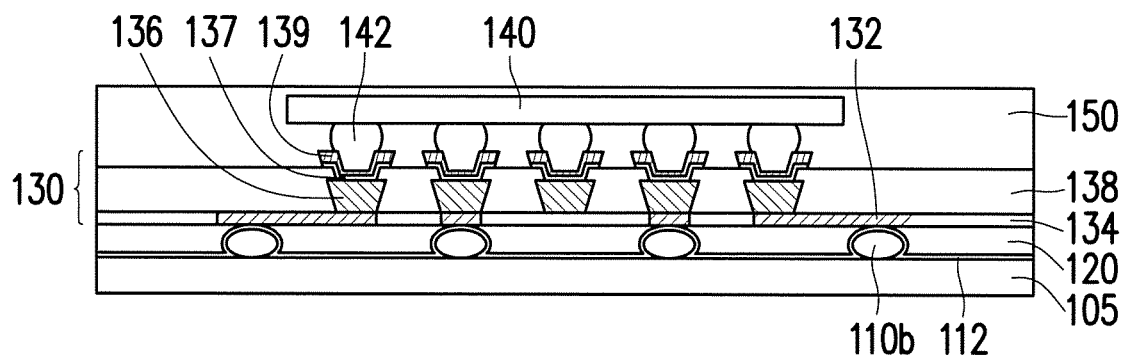
FIG. 12 is a cross-sectional view showing a package structure according to yet another embodiment of the disclosure.

FIG. 11 is a cross-sectional view showing a package structure according to another embodiment of the disclosure. FIG. 12 is cross-sectional view showing a package structure according to yet another embodiment of the disclosure. In the foregoing embodiments, the protrusions 110 disposed on the carrier 105 are in the form of block, so the formed openings 122 of the under bump supporting layer 120 are square openings. The scope of the present disclosure does not limit on the shape of the protrusions 110 and the formed openings 122 of the under bump supporting layer 120. In the embodiment shown in FIG. 11, the cross-sectional shape of each of the protrusions 110a disposed on the carrier 105 is trapezoidal, in other words, the size of the top surface of each of the protrusions 110a is less than the size of the bottom surface of the protrusion 110a. In the embodiment shown in FIG. 12, the cross-sectional shape of each of the protrusions 110b disposed on the carrier 105 is spherical, thus the formed openings 122 of the under bump supporting layer 120 are spherical openings. Nevertheless, the above-mentioned embodiments are merely examples and will not limit the scope of the present disclosure.

FIG. 13 to FIG. 16 are cross-sectional views showing part of a manufacturing method of a package structure according to another embodiment of the disclosure. The manufacturing method of a package structure of this embodiment is similar to the manufacturing method of the package structure of the above-mentioned embodiments. Therefore, the reference numerals and part of contents of the above-mentioned embodiments are also used to describe this embodiment, wherein the same reference numerals are used to represent the same elements, respectively, and thus descriptions of repeated technical contents will be omitted. Please refer to FIG. 13 to FIG. 16, a difference between the manufacturing method of the package structure of this embodiment and the manufacturing method of the package structure of the above-mentioned embodiments is explained below.

Figure 13:
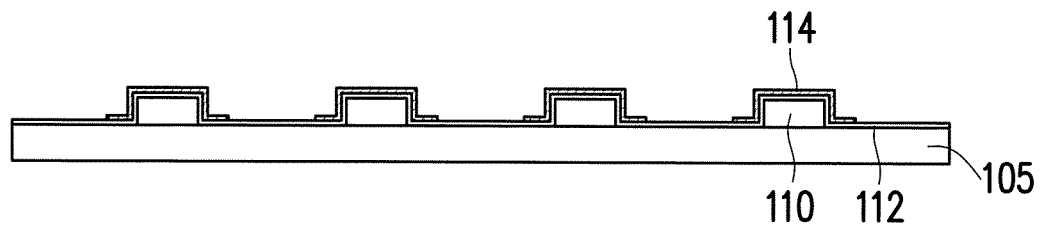
FIG. 13 to FIG. 16 are cross-sectional views showing part of a manufacturing method of a package structure according to another embodiment of the disclosure.
Figure 14:
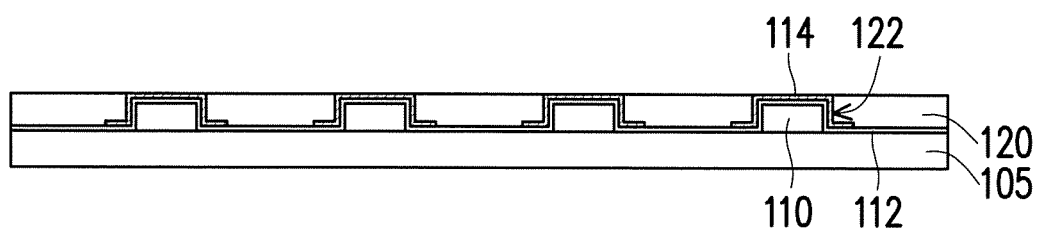

First, referring to FIG. 13, in the manufacturing method of the package structure of the present embodiment, an attachment layer 114 may be formed on the portion of the release layer 112 covering the protrusions 110 as shown in FIG. 13 (that is, the step shown in FIG. 13 may be performed after the step shown in FIG. 2 of forming the plurality of protrusions 110 and the release layer 112 on the carrier 105). In this embodiment, the method of forming the attachment layer 114 may include screen printing. That is, printing is performed by using a screen having a plurality of openings exposing the protrusions 110 to form the attachment layer 114. Then, referring to FIG. 14, the under bump supporting layer 120 is formed between the protrusions 110. The upper surface of the under bump supporting layer 120 and the top surface of the attachment layer 114 are coplanar. In this embodiment of FIG. 14, the material of the attachment layer 114 includes titanium, copper, nickel or silver. This embodiment is an example only and the scope of the disclosure will not limit on the material of the attachment layer 114.

Figure 15:
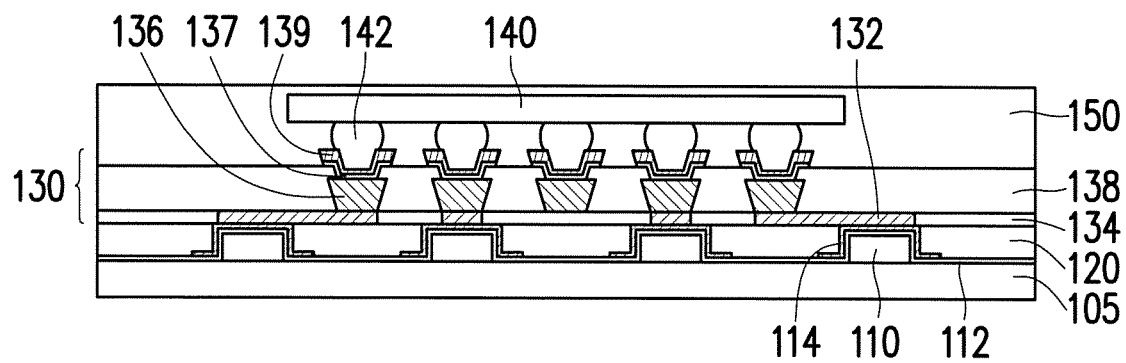
Figure 16:
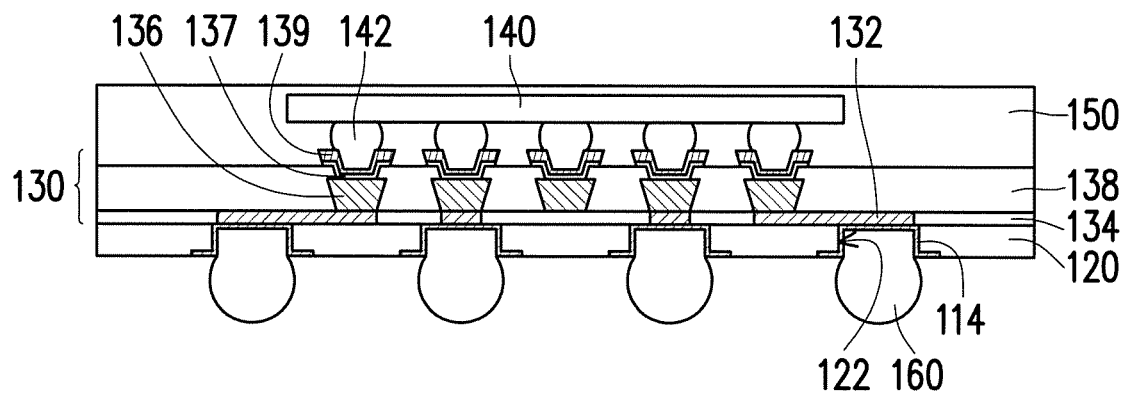

Next, the structure shown in FIG. 15 is obtained by successively performing the manufacturing steps shown in FIG. 4 to FIG. 9. Then the carrier 105 and the protrusions 110 are removed from the under bump supporting layer 120 and the attachment layer 114 to form the openings 122 on the under bump supporting layer 120 exposing the patterned circuit layer 132. The attachment layer 114, as shown in FIG. 16, covers an inner wall of each of the openings 122 and the portion of the patterned circuit layer 132 exposed by the openings 122. In this embodiment of FIG. 16, a bottom surface of the attachment layer 114 which is away from the patterned circuit layer 132 and a lower surface of the under bump supporting layer 120 which is away from the patterned circuit layer 132 are coplanar. Thereafter, a plurality of solder balls 160 are formed in the openings 122 of the under bump supporting layer 120, as shown in FIG. 16, also, the solder balls 160 are electrically connected to the patterned circuit layer 132 via the attachment layer 114. The bonding strength of the solder ball 160 is enhanced via the attachment layer 114. Accordingly, the manufacturing of the package structure 100 is substantially completed in the embodiment of FIG. 16.

FIG. 17 to FIG. 20 are cross-sectional views showing a manufacturing method of a package structure according to yet another embodiment of the disclosure. The manufacturing method of a package structure of this embodiment is similar to the manufacturing method of the package structure of the above-mentioned embodiments. Therefore, the reference numerals and part of contents of the above-mentioned embodiments are also used to describe this embodiment, wherein the same reference numerals are used to represent the same elements, respectively, and thus descriptions of repeated technical contents will be omitted. Please refer to FIG. 17 to FIG. 20, a difference between the manufacturing method of the package structure of this embodiment and the manufacturing method of the package structure of the above-mentioned embodiments is explained below.

Figure 17:
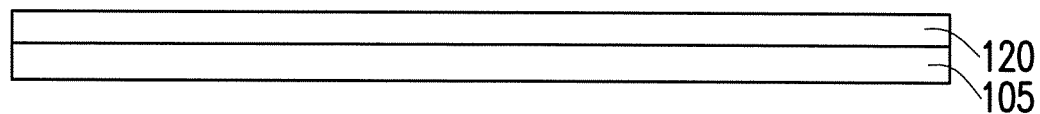
FIG. 17 to FIG. 20 are cross-sectional views showing a manufacturing method of a package structure according to yet another embodiment of the disclosure.
Figure 18:
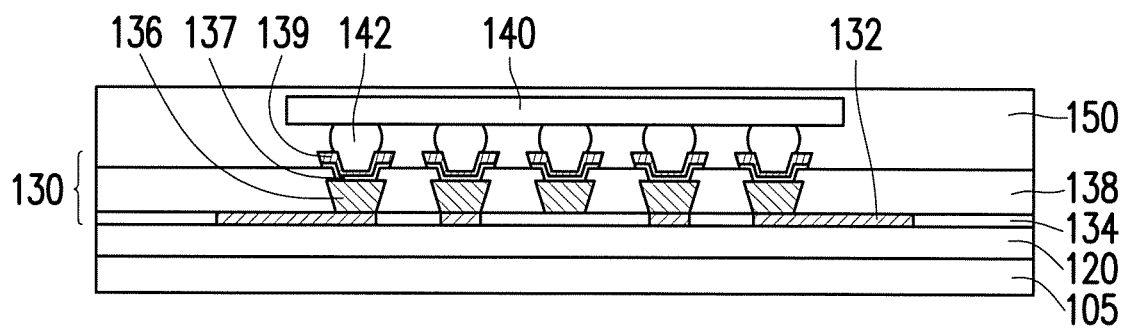
Figure 19:
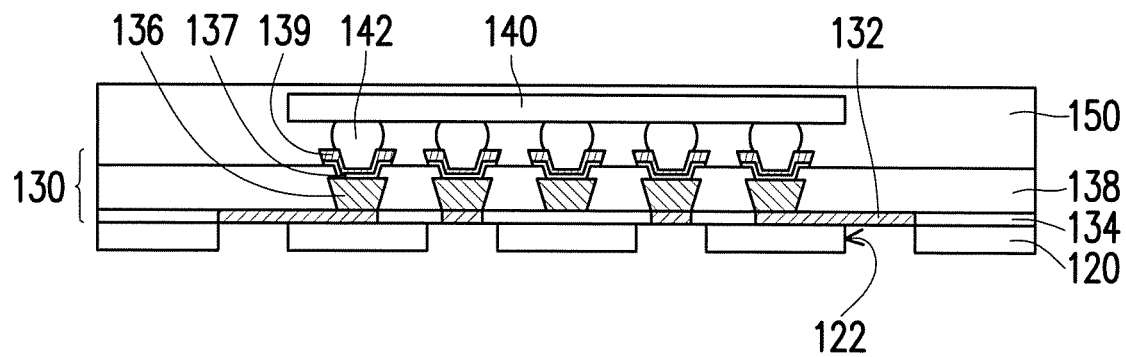

In this embodiment, the under bump supporting layer 120 may cover the upper surface of the carrier 105 entirely, as shown in FIG. 17. The release layer 112 in the foregoing embodiments may be selectively disposed between the carrier 105 and the under bump supporting layer 120. Then the manufacturing process may be made in accordance with the foregoing embodiments of FIG. 4 to FIG. 9. In other words, the steps of forming the redistribution layer 130, disposing the chip 140, and forming the encapsulant 150 are sequentially performed, thereby obtaining a structure as shown in FIG. 18. Then, the carrier 105 is removed and a patterning process is performed on the under bump supporting layer 120, so as to form a plurality of openings 122 as shown in FIG. 19. The openings 122 expose the patterned circuit layer 132. In this embodiment of FIG. 19, the patterning process may include laser drilling, dry etching, or wet etching.

In addition, in another embodiment, a material of the under bump supporting layer 120 may include photosensitive material. Before the carrier 105 is removed, that is, under the state shown in FIG. 18, the portion of the under bump supporting layer 120 for which the openings 122 are to be formed is exposed and then patterned. In more detailed, a portion of the under bump supporting layer 120 for which the openings 122 are to be formed may be exposed by using such as the ultraviolet light or laser. This embodiment is an example only, the actual exposed area may be determined by the positive photoresist or the negative photoresist of material of the under bump supporting layer 120. The portion of the under bump supporting layer 120 corresponding to the openings 122 will be cracked due to the exposure. When the carrier 105 is removed from the under bump supporting layer 120, the portion of the under bump supporting layer 120 corresponding to the openings 122 is removed accordingly. Therefore, the openings 122 shown in FIG. 19 for exposing the patterned circuit layer 132 may be formed on the under bump supporting layer 120. Thus in this embodiment, the openings 122 for exposing the patterned circuit layer 132 may be formed on the under bump supporting layer 120 while removing the carrier 105.

Figure 20:
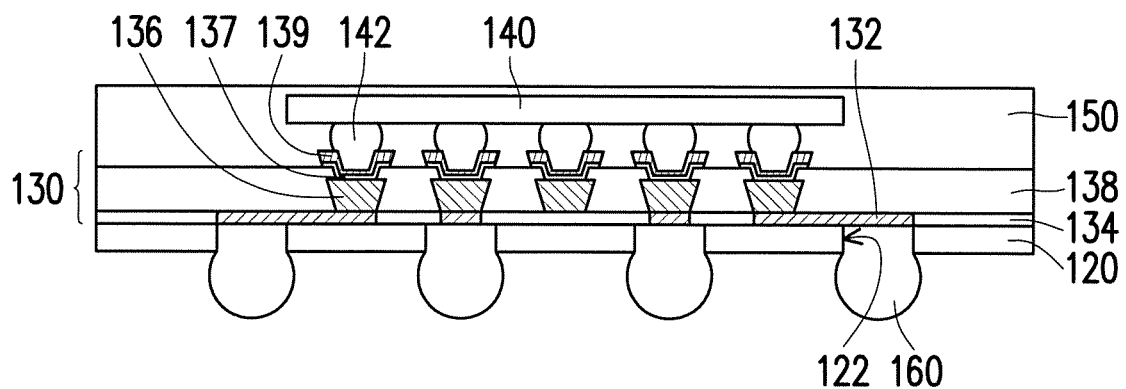

Then, as shown in FIG. 20, the solder balls 160 may be disposed in the openings 122 of the under bump supporting layer 120, and the solder balls 160 are electrically connected to the patterned circuit layer 132. Thus, the under bump supporting layer 120 may provide structural support and position alignment to the solder balls 160, and then the reliability of the package structure 100 may be increased. In addition, the under bump supporting layer 120 further prevents moisture from entering the package structure 100, thereby increasing the ability of the package structure 100 to block moisture and/or oxidation resistance.

Figure 21:
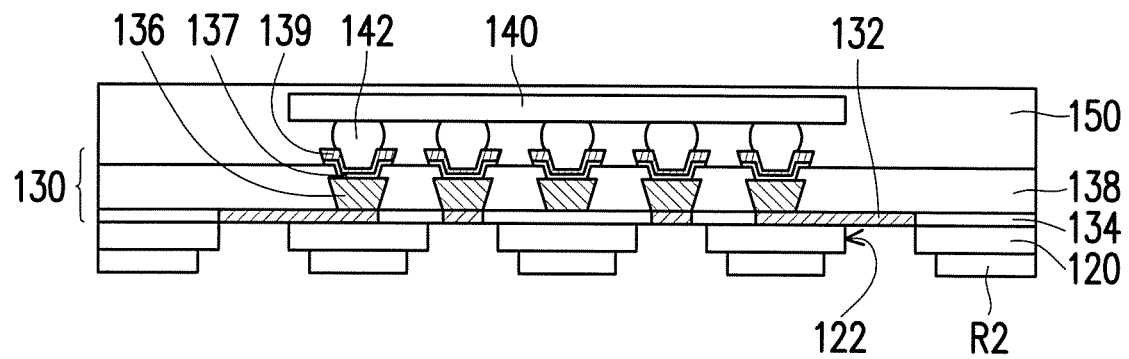
FIG. 21 to FIG. 23 are cross-sectional views showing part of a manufacturing method of a package structure according to yet another embodiment of the disclosure.
Figure 22:
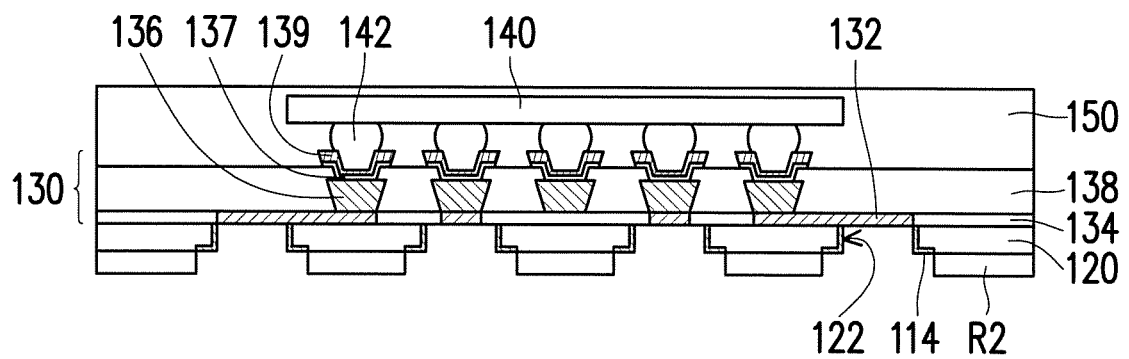
Figure 23:
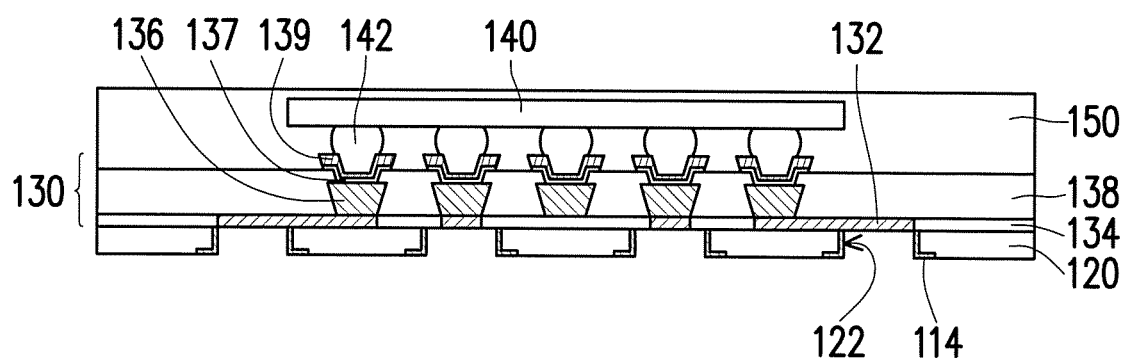

FIG. 21 to FIG. 23 are cross-sectional views showing part of a manufacturing method of a package structure according to yet another embodiment of the disclosure. The manufacturing method of the package structure of this embodiment is similar to the manufacturing method of the package structure of the above-mentioned embodiments. Therefore, the reference numerals and part of contents of the above-mentioned embodiments are also used to describe this embodiment, wherein the same reference numerals are used to represent the same elements, respectively, and thus descriptions of repeated technical contents will be omitted. Please refer to FIG. 21 to FIG. 23, a difference between the manufacturing method of the package structure of this embodiment and the manufacturing method of the package structure of the above-mentioned embodiments is explained below.

First, referring to FIG. 21, in the manufacturing method of the package structure of the present embodiment, a patterned photoresist layer R2 may be formed on the under bump supporting layer 120 (that is, the step shown in FIG. 21 may be performed after the step of FIG. 19 of forming the openings 122 for exposing the patterned circuit layer 132). The openings are exposed by the patterned photoresist layer R2.

Then, as shown in FIG. 22, a metallization process is performed by using the patterned photoresist layer R2 as a mask, to form the attachment layer 114. In this embodiment, the above-mentioned metallization process may be a plating (electroless plating) process, so that the attachment layer 114 is formed on the exposed portion of the patterned photoresist layer R2. The attachment layer 114 is formed by a chemical reaction on the inner walls of the openings 122. In this embodiment, the material of the attachment layer 114 may include titanium, copper, nickel or silver. Nevertheless, this embodiment is an example only but the scope of the disclosure is not limited thereto.

Then, referring to FIG. 23, the patterned photoresist layer R2 is removed. Then a plurality of solder balls 160 shown in FIG. 16 may be formed in the openings 122 of the under bump supporting layer 120, and a package structure 100 similar to that shown in FIG. 16 may be formed. The attachment layer 114 of the present embodiment in FIG. 23 is formed by the chemical reaction of the metal and the under bump supporting layer 120, so the attachment layer 114 and the lower surface away from the patterned circuit layer 132 of the under bump supporting layer 120 are coplanar. Also, there is no attachment layer 114 covering the surface of the patterned circuit layer 132.

In summary, according to the package structure and the manufacturing method thereof described in the embodiments of the disclosure, the under bump supporting layer is formed on the carrier first and then the redistribution layer is formed thereon. Thereafter, the under bump supporting layer with openings is formed. Thus, the package structure, which is manufactured by the method of forming the redistribution layer prior to disposing the chip, may include the under bump supporting layer, thereafter the structure supporting for bonding solder balls 160 are provided enough and help to the position alignment for the solder balls 160 are provided, so as to increase the reliability of the package structure. Furthermore, the attachment layer covers the inner walls of the openings and the portion of the patterned circuit layer exposed by the openings, thereby enhancing the connection strength between the solder balls, the openings and the patterned circuit layer. In addition, the under bump supporting layer may prevent the moisture from entering the package structure, thereby increasing the ability of the package structure to block moisture and/or oxidation resistance. Therefore, the disclosed package structure and the manufacturing method thereof may effectively improve the manufacturing yield and increase the structural reliability.

It will be apparent to those skilled in the art that various modifications and variations can be made to the disclosed embodiments without departing from the scope or spirit of the disclosure. It is intended that the specification and examples be considered as exemplars only, with a true scape of the disclosure being indicated by the following claims and their equivalents.

What is claimed is:

1. A package structure, comprising:
   a redistribution layer having a first surface, a second surface opposite to the first surface, and a patterned circuit layer embedded in the first surface, wherein an outer surface of the patterned circuit layer and the first surface are coplanar;
   a chip disposed on the second surface and electrically connected to the patterned circuit layer;
   an encapsulant disposed on the second surface and encapsulating the chip;
   an under bump supporting layer disposed on the first surface and including a plurality of openings, wherein the openings expose the outer surface of the patterned circuit layer;
   an attachment layer covering an inner wall of each of the openings in a conformal manner; and
   a plurality of solder balls respectively disposed on the under bump supporting layer and extended into the openings and electrically connected to the patterned circuit layer, wherein a bottom surface of the attachment layer away from the patterned circuit layer and a lower surface of the under bump supporting layer away from the patterned circuit layer are coplanar.

2. The package structure according to claim 1, wherein a first material of the under bump supporting layer and a second material of a dielectric layer of redistribution layer are different.

3. The package structure according to claim 1, wherein the redistribution layer further comprises:
   a plurality of conductive vias connecting to the first surface and the second surface and electrically connected to the patterned circuit layer; and
   an under ball metal layer disposed on the second surface and electrically connected to the conductive vias.

4. The package structure according to claim 3, wherein the redistribution layer further comprises:
   a first dielectric layer, wherein the patterned circuit layer is embedded in the first dielectric layer, and the outer surface of the patterned circuit layer and a surface of the first dielectric layer are coplanar to define the first surface; and
   a second dielectric layer disposed on the first dielectric layer, wherein the conductive vias pass through the second dielectric layer, and the under ball metal layer is disposed on the second dielectric layer.

5. The package structure according to claim 4, wherein a first Young's modulus of a third material of the first dielectric layer is less than a second Young's modulus of a fourth material of the second dielectric layer, and the first Young's modulus of the third material of the first dielectric layer is less than 10 GPa.

6. The package structure according to claim 1, wherein a thickness of the under bump supporting layer is in a range of 1 μm to 50 μm, or the thickness of the under bump supporting layer is greater than or equal to one tenth of the diameter of each of the openings.

7. The package structure according to claim 1, wherein a material of the attachment layer includes titanium, copper, nickel or silver.

8. The package structure according to claim 1, wherein the attachment layer covers a portion of the patterned circuit layer exposed by the openings.

9. The package structure according to claim 2, wherein the first material of the under bump supporting layer is a mixture of organic polymer material and inorganic polymer material.

* * * * *